United States Patent
Hayashida et al.

(10) Patent No.: US 8,116,618 B2
(45) Date of Patent: Feb. 14, 2012

(54) HEATING APPARATUS, SUBSTRATE PROCESSING APPARATUS, AND METHOD OF MANUFACTURING SEMICONDUCTOR DEVICES

(75) Inventors: Akira Hayashida, Toyama (JP); Masaaki Ueno, Toyama (JP); Masakazu Shimada, Toyama (JP); Masashi Sugishita, Toyama (JP); Toshimitsu Miyata, Toyama (JP); Kimio Kitamura, Osaka (JP); Kenji Tanaka, Osaka (JP); Jyunichi Nishihara, Osaka (JP)

(73) Assignees: Hitachi Kokusai Electric Inc., Tokyo (JP); Teitokusha Co., Ltd., Osaka (JP)

( * ) Notice: Subject to any disclaimer, the term of this patent is extended or adjusted under 35 U.S.C. 154(b) by 903 days.

(21) Appl. No.: 12/213,823

(22) Filed: Jun. 25, 2008

(65) Prior Publication Data

US 2009/0016706 A1 Jan. 15, 2009

(30) Foreign Application Priority Data

Jun. 25, 2007 (JP) ................................ 2007-166998
Jun. 12, 2008 (JP) ................................ 2008-154369

(51) Int. Cl.
*A45D 20/40* (2006.01)
*A21B 2/00* (2006.01)
(52) U.S. Cl. ........................ 392/416; 392/407; 392/420
(58) Field of Classification Search ........................ None
See application file for complete search history.

(56) References Cited

U.S. PATENT DOCUMENTS

| 4,975,561 | A  | * | 12/1990 | Robinson et al. | ............. | 219/390 |
| 7,184,657 | B1 | * | 2/2007  | Camm et al.     | ................. | 392/418 |
| 7,684,683 | B2 | * | 3/2010  | Yamazaki et al. | ............ | 392/419 |
| 2008/0152330 | A1 | * | 6/2008 | Camm et al. | ................. | 392/418 |

FOREIGN PATENT DOCUMENTS

| JP | 07-321059 A | 12/1995 |
| JP | 11-121391 A | 4/1999 |
| JP | 2002-050583 A | 2/2002 |
| JP | 2003-139468 A | 5/2003 |
| JP | 2004-119510 A | 4/2004 |
| JP | 2005-032883 A | 2/2005 |
| JP | 2006-114848 A | 4/2006 |
| WO | WO-2007/023855 A1 | 3/2007 |

OTHER PUBLICATIONS

JPO Notification of Reason for Refusal, App. No. 2008-154369, Dispatch No. 477657, Dispatch Date: Aug. 11, 2009 (4 pages).

* cited by examiner

*Primary Examiner* — Thor Campbell
(74) *Attorney, Agent, or Firm* — Rader, Fishman & Grauer PLLC

(57) ABSTRACT

A heating apparatus comprises a wall for surrounding and defining a heating space, a heating element mounted on the inner side of the wall, reflecting members for reflecting the heat emitted from the heating element. Also, a moving unit joined to one end of each of the reflecting members for moving the reflecting members. Moreover, pivotal members joined to the reflecting members beside more their respective other side than one side of the reflecting members for controlling as pivots the movement of the reflecting member driven by the moving unit.

14 Claims, 12 Drawing Sheets

HEATING APPARATUS, SUBSTRATE PROCESSING APPARATUS, AND METHOD OF MANUFACTURING SEMICONDUCTOR DEVICES

BACKGROUND OF THE INVENTION

1. Field of the Invention

The present invention relates to a semiconductor device manufacturing technology or more particularly a heat processing technology for processing a substrate to be processed while being heated up by heating elements in a processing chamber and also relates to a heating apparatus, a substrate processing apparatus, and a method of manufacturing semiconductor devices.

2. Description of the Related Art

FIG. 1 is a schematic cross sectional view of a processing furnace 500 equipped with a conventional heating apparatus. The conventional heating apparatus comprises a metallic casing 501 arranged of substantially a tubular shape with the upper end closed, a thermal insulator material 502 arranged of substantially a tubular shape and disposed at the inside of the casing 501, and heating wires 503 mounted to the inner wall of the thermal insulator material 502. The heating apparatus contains a thermal equalizer tube 504 and a reactor tube 505 which acts as a processing chamber and the action of heating up a wafer 506 in a given manner is carried out in the reactor tube 505.

It has been demanded in the metallic wiring process (Cu annealing etc.) to decrease the processing temperature (to not higher than 300° C.) and improve the throughput. Therefore, the shortening of the temperature increase and decrease of the wafer is essential. However, for responding to the above demand, such a conventional heating apparatus as shown in FIG. 1 employs a large amount of thermally insulating materials for permitting the use of heaters in middle and high temperature ranges, hence being low in the temperature increase and decrease response and hardly improving the throughput. It is thus desired to provide an improved heating apparatus which is high in the thermal response.

Disclosed in Patent Citation 1 is a substrate processing apparatus which allows its heating space to be cooled down rapidly with the cooling gas supplied through the pins which are provided to extend through the heating elements. The thermal response in the heating apparatus can thus be improved by modifying the cooling property.

As the wafer processing action has significantly been minimized in the structural arrangement, wafers have to be further decreased in the variations throughout their surface (including differences in the surface temperature and the layer thickness). Patent Citation 2 discloses to decrease the surface variations with the use of reflector mirrors mounted to the upper end of the processing chamber for reflecting and concentrating the heat emitted from the heaters at the center of the wafers.

However, the reflector mirrors are fixed in their position while the temperature adjustment at the center of the wafers is conducted not separately of the edge, thus failing to eliminating the surface variations.

A thermal processing apparatus disclosed in Patent Citation 3 has reflectors mounted movably for reflecting towards the substrate the heat emitted from the heaters which are mounted above and along the outer edge of the substrate. However, the reflectors can simply be moved upward and downward from the substrate for adjusting the temperature of the processing action, hence failing to eliminate the surface variations.

Another thermal processing apparatus disclosed in Patent Citation 4 has an ultra violet lamp disposed at a position opposite to the substrate and reflectors mounted between the ultraviolet lamp and the substrate for moving or tilting at angles so that the ultra violet light falls uniformly on the substrate. However, this discloses or teaches non of the surface variations.

A further thermal processing apparatus disclosed in Patent Citation 5 has temperature sensors disposed for measuring the temperature at both the edge and the center of the substrate at the uppermost level, whereby the action of heating means can be controlled separately by the temperature information from the temperature sensors. However, while the action of controlling the heating means is troublesome, the surface variations may sufficiently be eliminated without success.

Patent Citation 1: WO2007/023855.
Patent Citation 2: Japanese Patent Laid-open Publication No. 2005-32883.
Patent Citation 3: Japanese Patent Laid-open Publication No. (Heisei) 7-321059.
Patent Citation 4: Japanese Patent Laid-open Publication No. 2006-114848.
Patent Citation 5: Japanese Patent Laid-open Publication No. 2004-119510.

SUMMARY OF THE INVENTION

It is hence an object of the present invention, in view of the conventional aspects, to further attenuate the variations on the surface of a substrate to be processed.

For achievement of the above object of the present invention, a heating apparatus according to the present invention is provide comprising a wall for surrounding and defining a heating space, a heating element mounted on the inner side of the wall, reflecting members for reflecting the heat emitted from the heating element, a moving unit joined to one end of each of the reflecting members for moving the reflecting members, and pivotal members joined to the reflecting members beside more their respective other side than one side of the reflecting members for controlling as pivots the movement of the reflecting member driven by the moving unit.

The heating apparatus according to the present invention allows the moving mechanism to be driven in response to the surface variation for changing the reflection of the heat, thus further attenuating the variations on the surface of a substrate to be processed.

Other objects, arrangements, and effects of the present invention will be apparent from the detailed description of the preferred embodiments described below.

DESCRIPTION OF THE PREFERRED EMBODIMENTS

Figure 1:
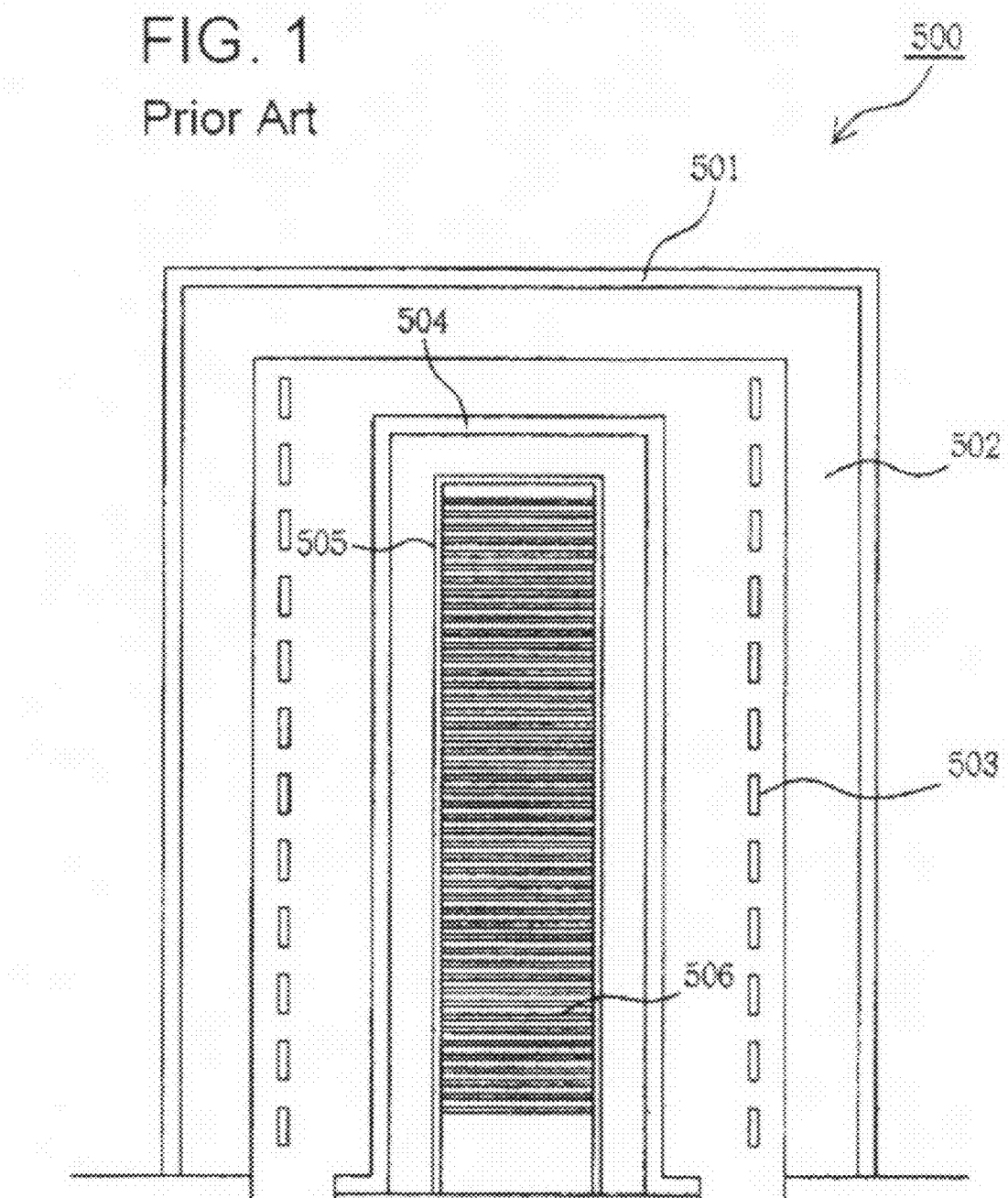
FIG. 1 is a schematic cross sectional view of a processing furnace using a convention heating apparatus.

The present invention will be described in more detail referring to the accompanying drawings.

One of the best modes for embodying the present invention will be described in the form of a first embodiment in conjunction with the drawings.

As shown in FIGS. 2 to 7, a substrate processing apparatus 1 comprises substantially a reactor container 309 acting as a processing chamber 308, a heating module 3 disposed at the outer periphery of the reactor container, and a main controller module 4.

The heating module 3 comprises substantially a ceiling 10, an intermediate unit 11 of a tubular shape, a lower case 12, a terminal case 13, and heating elements 20 disposed in the intermediate unit 11. The ceiling 10 has an exhaust gas passage 81 of an elbow shape provided therein to open at the lower side and one side. A reflecting member 90 is disposed beneath the ceiling 10. The intermediate unit 11 has an inner shell 50 thereof supported throughout the circumference by an outer shell 60 for accommodating the heating elements 20 therein and is protected at the outer side with a decorative panel 70. The inner shell 50 and the outer shell 60 are made of an electrically conductive material such as stainless steel or any other metallic material.

A cooling gas infeed duct 7y is provided between the upper side of the intermediate unit 11 and a gas intake attachment 7x. An open/close valve 7a or more particularly a butterfly valve is mounted at the open end of the gas intake attachment 7x for opening and closing the flow passage. The gas intake attachment 7x is connected with a cooling gas supply conduit 7. A gas passage 14 is provided in a tubular shape between the inner shell 50 and the outer shell 60 for conveying the cooling medium. The cooling gas infeed duct 7y is communicated to the gas passage 14 by a group of conduits 61 disposed at substantially equal intervals in an annular arrangement. Also, the discharge passage 81 is communicated to a forced discharge conduit 8 equipped with a discharge blower 8a for forcibly discharging the gas from the internal or heating space provided in the heating apparatus 3. This allows the air or inert gas supplied from the cooling gas infeed conduit 7 to be conveyed as the cooling gas through the gas passage 14 and a set of insulator apertures, which will be explained later, to the heating space 18 before discharged from the forced discharge conduit 8.

The reactor container 309 comprises a thermal equalizer tube 315 and a reactor tube 310 arranged concentrically in the heating space 18 while the processing chamber 308 is formed in the reactor tube 310. A boat 300 on which the wafers 305 are horizontally placed in a stack is accommodated in the processing chamber 308. The boat 300 can be loaded into and out from the processing chamber 308 using a boat elevator which is not shown.

Also, the reactor tube 310 is communicated with a reactive gas infeed conduit 5x and a reacting gas discharge conduit 6x. The reactive gas infeed conduit 5x is equipped with a flow controller 5a while the reacting gas discharge conduit 6x is equipped with a pressure controller 6a. When a desired amount of the reactive gas has been introduced with the reactor tube 310 remaining at a predetermined pressure, the existing gas is discharged from a discharge outlet 6y to the discharge conduit 6x before finally released to the outside of the processing chamber.

Another cooling gas supply conduit 5y is communicated with an thermal equalizer internal space 317 defined between the thermal equalizer 315 and the reactor tube 310. The cooling gas supply conduit 5y is equipped with a flow controller 5b. The open/close valve 7a is mounted to the gas intake attachment 7x. The forced discharge conduit 8 is equipped with the discharge blower 8a which acts as a discharging device. In brief, the cooling gas can controllably be supplied into both the thermal equalizer tube internal space 317 and the heating space 18.

The heating elements 20 are divided into a desired number of zones Z1 to Z5 arranged axially of the tubular shape of the intermediate unit 11 and can thus be controlled at each zone. Each zone is accompanied with a temperature detector for detecting the temperature at the zone. Alternatively, the zones of the heating elements 20 may be shaped in the same pattern for producing the heat equally throughout the zones.

The action at each section of the substrate processing apparatus 1 is controlled by the main controller module 4. For example, the condition of the processing the wafers 305 in the reactor tube 310 is monitored and controlled by the main controller module 4. The main controller module 4 comprises a temperature monitor 4a, a heating controller (heater controller) 4b, a reflection controller 4c, a first flow controller 4d, a pressure controller 4e for controlling the pressure in the reactor tube 310, a second flow controller 4f, a discharge controller 4g, and a drive controller 4h for controlling the mechanical movements including the boat elevator.

The temperature monitor 4a is designed for detecting the temperature of three, first to third, temperature detectors TC1 to TC3. The first temperature detector TC1 is mounted to each of the zones Z1 to Z5 as located close to the heating elements 20. The second temperature detector TC2 is mounted to each of the zones Z1 to Z5 as surrounding the reactor tube 310. The third temperature detector TC3 is mounted above the reactor tube 310 or at a particular location such as the upper center of the reactor tube 310.

The heating controller 4b is arranged responsive to the measurement of the temperature monitor 4a for controlling the heat generated by the heating elements 20 at each of the zones Z1 to Z5. The reflection controller 4c is arranged responsive to the measurement of the temperature monitor 4a for controlling the action of an actuator 99 for driving the reflecting member 90. More specifically, the reflection controller 4c controls the tilting of the reflecting member 91 mirror finished with its lower side thus to modify the concentration of reflected heat at the upper center of the reactor tube 310 for controlling the temperature.

The first flow controller 4d is designed for controlling the action of the flow controller 5a while the pressure controller 4e is designed for controlling the action of the pressure controller 6a thus to determine the supply and pressure of the reactive gas. The second flow controller 4f is designed for controlling the action of the flow controller 5b while the discharge controller 4g is designed for controlling the action of the open/close valve 7a and the discharge blower 8a thus to determine the supply and discharge of the cooling gas.

Figure 2:
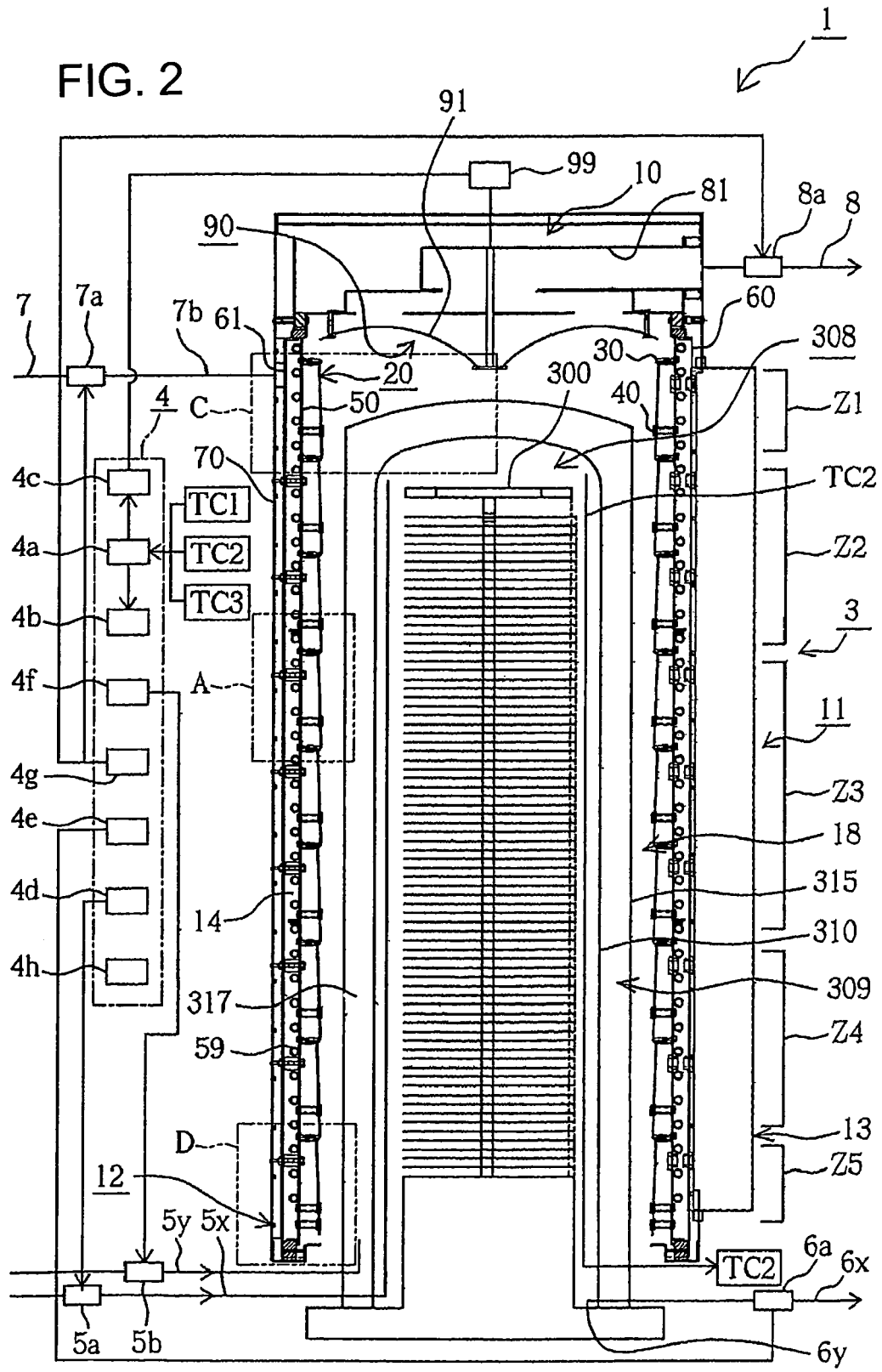
FIG. 2 is a longitudinally cross-sectional view schematically showing a substrate processing apparatus according to the present invention.
Figure 3:
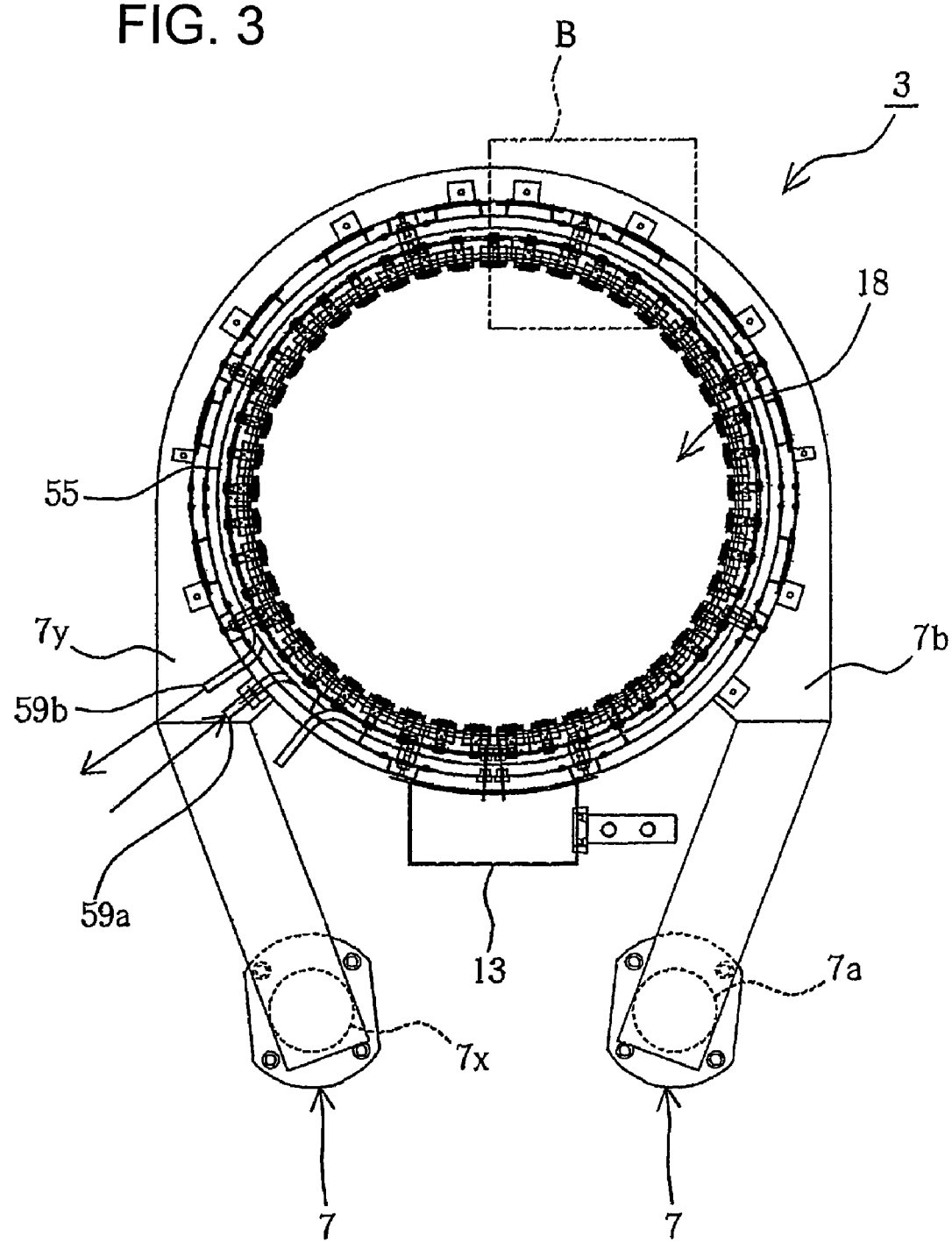
FIG. 3 is a transversely cross-sectional view of the proximity of a ceiling.
Figure 4:
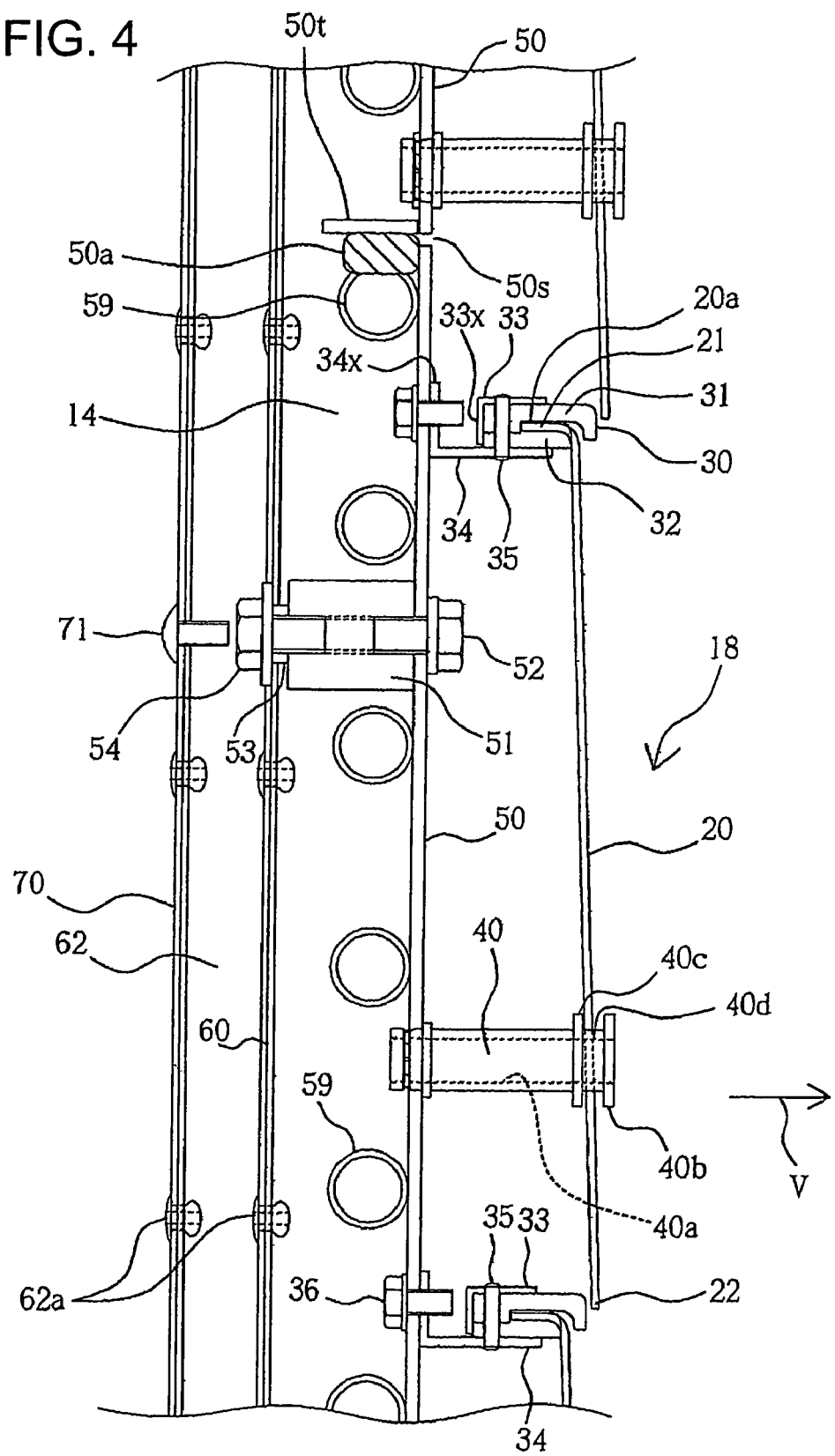
FIG. 4 is an enlarged view of the region A in FIG. 2.
Figure 5:
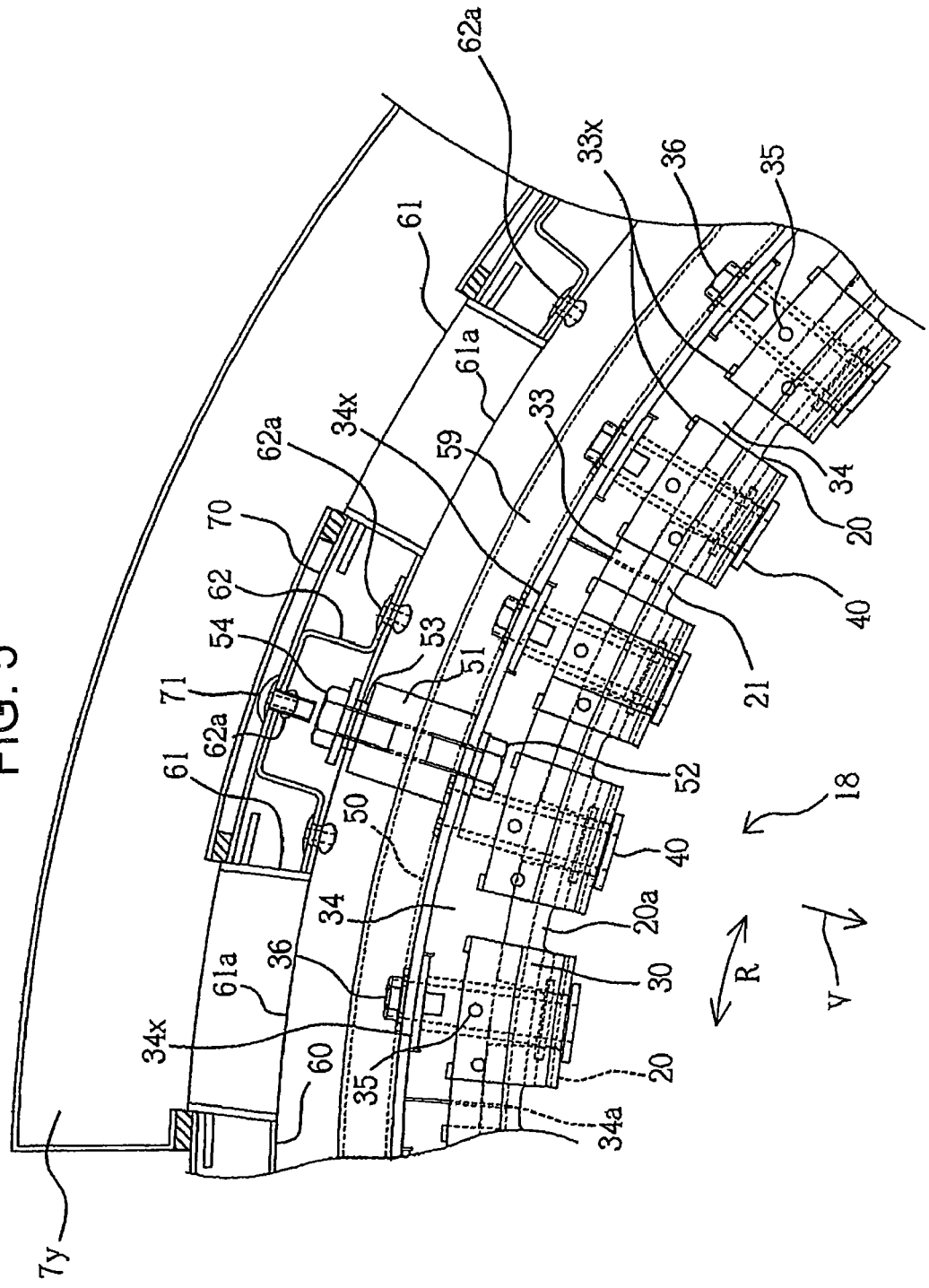
FIG. 5 is an enlarged view of the region B in FIG. 3.
Figure 6:
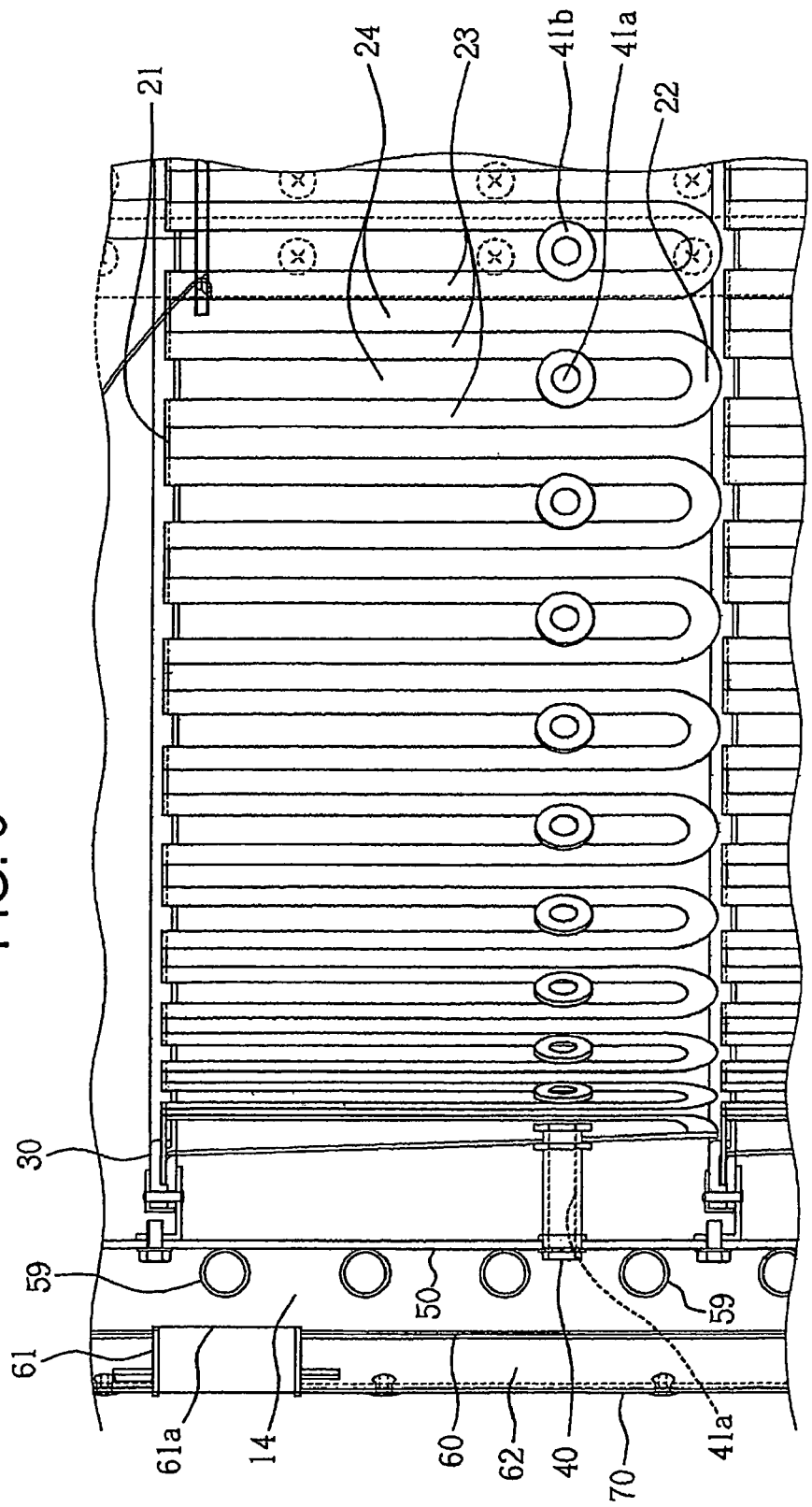
FIG. 6 is an enlarged view of the region C in FIG. 2.

FIG. 4 is an enlarged view showing the section A in FIG. 2. The heating elements (heater wires) 20 are fixedly mounted to the inner shell 50 by hanging insulators 30 made of an electrically insulating material such as alumina. The heating elements 20 are fabricated as flat heating members from a heating material, such as Fe—Al—Cr alloy, which can heat up quickly and formed in a strip shape in the cross section for increasing the heating area. More particularly, the heating element 20 is arranged in a zigzag shape extending up and down with its turned portions 21, 22 provided at both sides. The two, upper and lower, turned portions 21, 22 are displaced from each other by a half pitch as sandwiching element portions 23 and gap portions 24 arranged alternately. The upper turned portions 21 of the heating element 20 are bent inwardly to have bent portions 20a which are then held by their respective hanging insulators 30. The inner side of the inner shell 50 is mirror finished for reflecting and directing the heat emitted from the back side of the element portions 23 of the heating element 20 through the gap portions 24 towards the heating space 18.

The hanging insulator 30 comprises an upper insulator 31 and a lower insulator 32 which both are made of a heat-resistant insulating material such as alumina, sandwiched between an upper fitting 33 and a lower fitting and joined together by a pin 35 in welding manner to the corresponding bent portion 20a of the heating element 20 while holding the same from both, upper and lower, sides. The other end of the lower fitting 34 is bent and joined at two locations by bolts 36 to the inner shell 50.

A number of fast cooling pipes 40 are mounted to the inner shell 50 for feeding the cooling gas through its communicating bore 40a from the gas passage 14 to the inside of the inner shell 50 as projecting inwardly from the inner side of the inner shell 50. The fast cooling pipes 40 are made of a heat-resistant, electrically insulating material such as alumina. The fast cooling pipe 40 is designed for inhibiting the movement at the intermediate of the heating element 20 with its extending-through portion 40d extending through the gap portion 24 of the heating element 20 and its flange portions 40b, 40c of substantially a circular shape which are elongated outwardly at a right angle to the extending direction V along which the fast cooling pipe 40 extends through the heating element 20. More specifically, the extending-through portion 40d of the fast cooling pipe 40 serves as a groove between the two flange portions 40b, 40c. In addition, the heating element 20 is overlapped at the lower end with the upper end of the hanging insulator 30 at the lower level so that its movement along the extending direction of the fast cooling pipe 40 is inhibited.

A water cooling conduit 59 is mounted as a cooling medium running passage on the back side of the inner shell 50. The water cooling conduit 59 is arranged in a spiral form directly on the back or outer side of the inner shell 50, extending axially. As the inner shell 50 is prevented from increasing its temperature by the cooling medium such as cooling water running through water supply and discharge passages 59a, 59b, its temperature can remain substantially at a constant degree.

The outer shell 60 is insulatingly mounted by a set of connecting insulators 51 to the outer side of the inner shell 50. The connecting insulators 51 are made of an alumina material which has both properties of the electrical insulation and the resistance to heat and permit the outer shell 60 to receive no current even if the inner shell 50 accidentally comes into direct contact with the heating elements 20 and becomes short-circuited.

The connecting insulators 51 are fixedly joined at the inner end by first bolts 52 to the inner shell 50. The connecting insulators 51 are fixedly joined at the outer end to the outer shell 60 by second bolts 53 via annular hollow collars 53 made of a heat-resistant insulating material. As each of the collars 53 is set to extend through the mounting hole in the outer shell 60 with its thickness greater than that of the outer shell 60, it produces a clearance (gap) between the head at the lower side of the second bolt 54 and the outer surface of the connecting insulator 51. Accordingly, when the inner shell 50 is expanded by thermal expansion, its expansion can be offset by the clearance thus protecting the outer shell 60 from receiving any thermal stress and generating any deformation.

The decorative panel 70 is mounted as an outermost shell or side wall by pillars 62 to the outer side of the outer shell 60. The pillars 62 are joined at their flanges by, for example, metallic rivets 62a to both the outer shell 60 and the decorative panel 70 while the outer shell 60 has tubular openings 61a provided at the upper end thereof for communication with the gas passage 14. As pipes 61 are mounted to communicate at one end to the openings 61a, they extends through the decorative panel 70 and their other ends are communicated with the cooling gas infeed duct 7y.

Referring to FIG. 4, the inner shell 50 are separated into segments along the vertical direction. Any two, upper and lower, adjacent segments of the inner shell 50 are separated from each other by a gap 50s. A thermally insulating blanket 50a made of a thermally insulating material such as ceramic fiber is disposed between a first flange 50t provided at the lower end of the upper segment and the water cooling conduit 59 mounted to the lower segment of the inner shell 50, thus inhibiting the escape of heat from the gap 50s and thermally separating the two, upper and lower, segments from each other.

Figure 7:
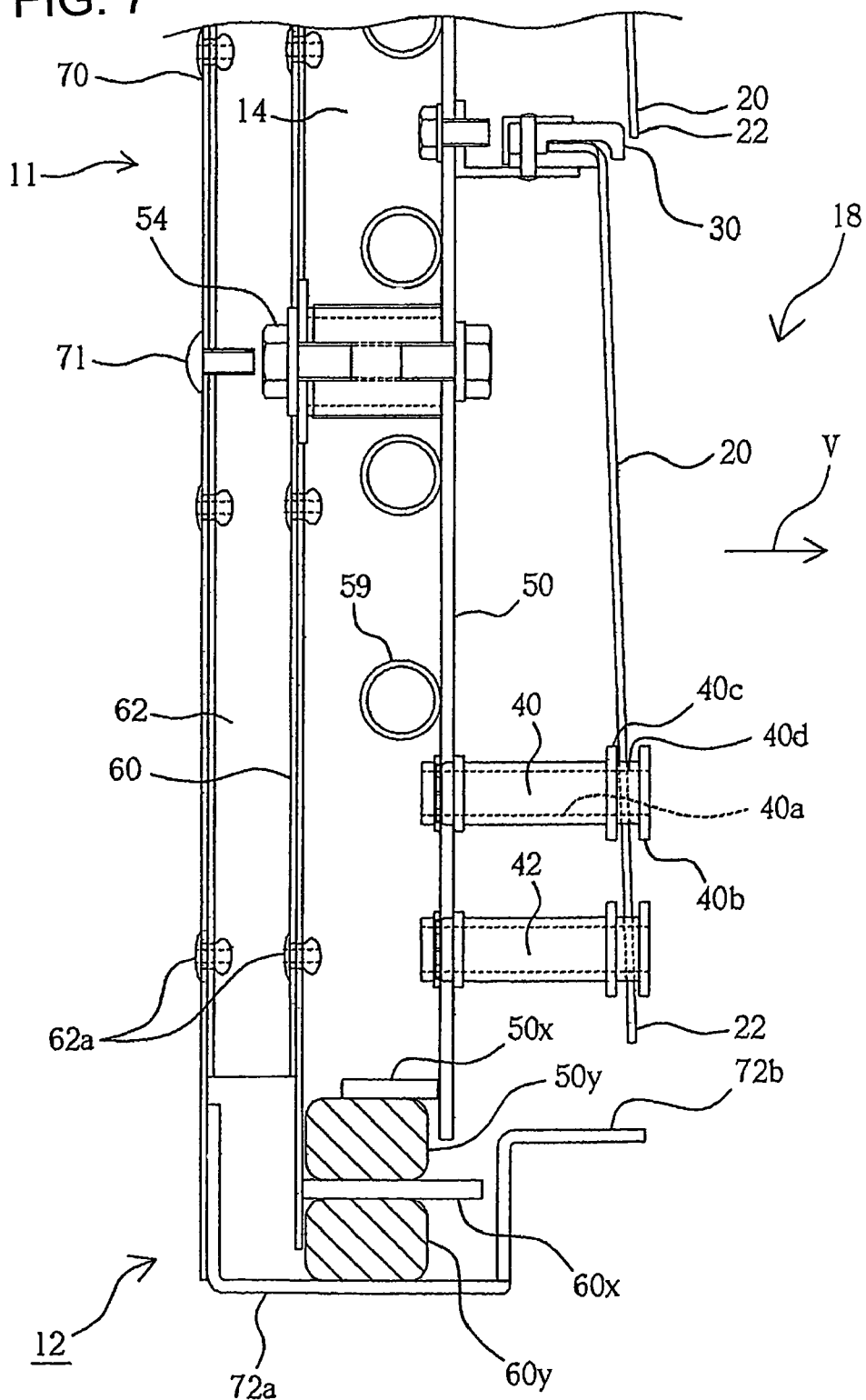
FIG. 7 is an enlarged view of the region D in FIG. 2.

Referring to FIG. 7, a thermally insulating blanket 50y made of an electrically, thermally insulating material is disposed between a second flange 50x provided outwardly at the lower end of the lowermost segment of the inner shell 50 and a third flange 60x provided inwardly at the lower end of the outer shell 60 at the lowermost end of the intermediate unit 11. This allows the inner shell 50 and the outer shell 60 to be electrically insulated from each other and remain air-tightened by the thermally insulating blanket 50y between them. In addition, a thermally insulating blanket 60y made of a thermally insulating material is disposed between the third flange 60x and a bottom cover 72a for ensuring the air tightness of the internal space in the inner shell 50. The same arrangement is provided between the intermediate unit 11 and the ceiling 10 for ensuring both the electrical insulation and the air tightness. The lowermost heating element 20 at the bottom level is supported by an extra water cooling conduit 42 which is different from the water cooling conduits 40 mounted to the heating element 20 for inhibiting the displacement at the intermediate of the heating element 20.

As the wafer processing action has significantly been minimized in the structural arrangement, wafers have to be further decreased in the variations throughout their surface. In particular, the wafers 305 carried at the upper of the boat 300 remain lower in the temperature specifically at the center than at the edge because of escape of the heat through the ceiling unit 10. This will ensure no uniformity of the thermal processing action between the center and the edge of the wafers. Also in the CVD action, the processing gas is commonly supplied from the outer edge of the boat and its concentration may be declined at the center of the boat thus decreasing the thickness of layers at the center of the wafers as compared with at the outer edge.

It is hence demanded for compensating retardation of the reaction speed due to the declination in the concentration of the processing gas in the CVD action to hold the temperature higher at the center than at the edge of the wafers. For the purpose, a technique similar to the prior art described previously is proposed for having the reflectors fixedly mounted in order to reflect and focus the rays of heat emitted from the peripheral heating elements onto the center of the boat and increase the heating energy at the center of the wafers, hence eliminating the variations in the temperature throughout the wafer surface.

However, as the heater output is varied between the heating up time and the stable time, the controlled position at a single angle of the reflectors may hardly overcome the variations throughout the surface of the wafers. Since the heater output is greater at the heating up time than at the stable time, the reflectors controlled to the angle for the stable time cause the temperature to be increased higher at the center than at the edge of the wafers at the heating up time. Otherwise, the reflectors controlled to the angle for the heating up time may decline the temperature to a lower degree at the center than at the edge in the stable time (annealing process or layer depositing process).

In some process sequence, the wafer processing action starts from the end of the heating up time for shortening the overall processing duration of time. This will also require frequent controlling actions for eliminating the surface variations of the wafers.

Figure 8:
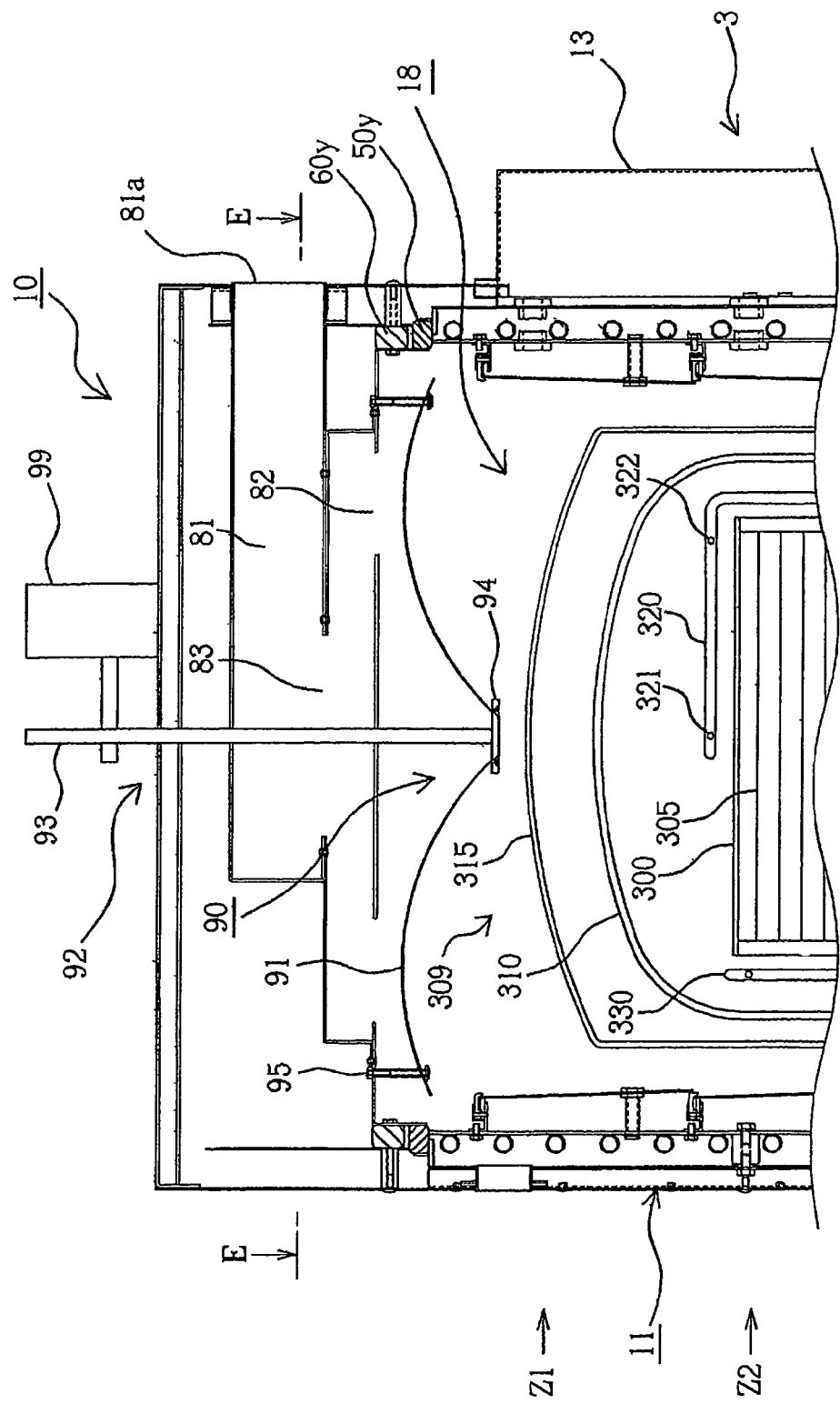
FIG. 8 is an enlarged view of the ceiling shown in FIG. 2.
Figure 9:
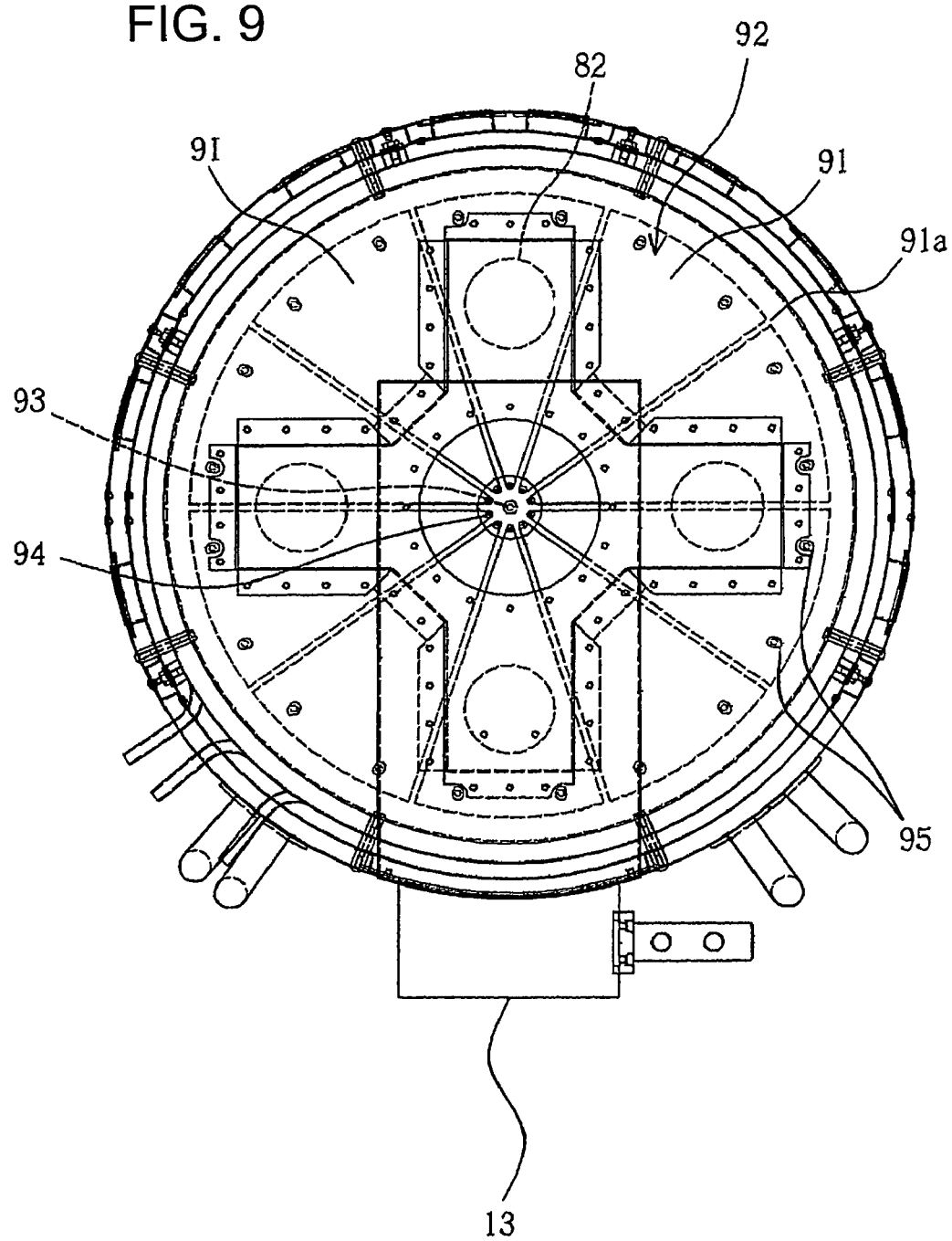
FIG. 9 is a cross sectional view taken along the line E-E of FIG. 8.

As shown in FIGS. 8 and 9, the reflector 90 at the ceiling 10 in this embodiment has a group of reflecting members 91 arranged to be moved by a moving mechanism 92 in response to the temperature at the surface of the wafers so that the reflecting members 91 are set to a favorable angle for attenuating the surface variations of the wafers.

The ceiling unit 10 has an discharge conduit 81 provided therein for exhausting the atmosphere in the heating space 18. Similar to the construction of the lower unit 12, the ceiling unit 10 is equipped with a combination of flanges and thermally insulating cushions (thermally insulating blankets) for ensuring both the electrical insulation and the air tightness of the inner shell 50 while offsetting the thermal expansion and contraction of the inner shell 50.

The reflector 90 is mounted to the lower side of the ceiling unit 10 for reflecting the heat (light) emitted from the heating elements 20. In the reflector 90, the reflecting members 91 made of an arcuate sheet form are tilted to angles by the action of the moving mechanism 92 and an actuator 99 for changing the direction of reflected rays of the heat thus to control the temperature.

More particularly, the reflecting member 91 is arranged of a triangular shape when viewed from the bottom and substantially an arc shape when viewed from the side. As shown in FIGS. 8 and 9, the reflecting members 91 arcuately extend from the center to the outside of the edge of the wafer 305. In other words, the reflecting members 91 are disposed radially to cover from the center to the outer boundary of the heating space 18. Preferably, as shown in FIGS. 8 and 9, the reflecting members 91 are arcuate as curved towards the ceiling side while extending from the center to the outside of the edge of the wafer 305. This allows the heat to be reflected by the entire surface, from the tip end to the outer circumferential end, of the reflecting members 91, whereby the reflection efficiency will be increased and the concentration of the heat will be improved. As the reflection of the heat is improved, the thermal insulating effect of the ceiling 10 will enhance. Preferably, the reflecting members 91 are extended from the center of the wafer 305 to the outermost end along the vertical direction perpendicular to the circumferential direction along which the heating elements 20 are supported. As the result, the reflective surface area will increase thus improving the reflection efficiency, the concentration of the heat, and the thermal insulating effect of the ceiling 10.

The reflecting members 91 are spaced at equal intervals of a gap 91a along the circumferential direction. The reflecting members 91, each arranged of a triangular (fan-like) shape, are rowed in an annular form. Preferably, the reflecting members 91 are arranged identical in the shape and placed at equal intervals along the circumferential direction. Accordingly, the flow of exhaust gas from the heating space 18 can be divided equally when passed through the gaps 91a, hence minimizing a difference in the temperature throughout the surface of the wafers. Preferably, when the gaps 91a are arranged identical in the width along the circumferential direction, the flow of discharge can be divided more equally along the circumferential direction thus further minimizing a difference in the temperature throughout the wafer surface.

The moving mechanism 92 has a center plate 94 sustained by a moving member or shaft 93 for moving upward and downward and joined with the tip end of each of the reflecting members 91 which in turn is supported at the other end or outer circumferential end by two bolts 95 acting as supporting members. This allows the reflecting members 91 arranged annually to be simultaneously controlled to a desired angle by the upward and downward action of the shaft 93 for producing the reflectivity equally along the circumferential direction in the heating space 18. Also, as its adjustment of the angle is carried out simply by the upward and downward action of the shaft 93, the moving mechanism 92 remains simple in the construction. Moreover, since the heat is reflected in point symmetrical fashion about the center of the shaft 93, it can heat up uniformly the wafer 305.

The actuator 99 is arranged responsive to a signal received from a reflection controller 4c for lifting the shaft 93 upward and downward thus to controllably determine the angle of the reflecting members 91 along the shaft 93. Preferably, the center plate 94 joined with the tip end of each reflecting member 91 is arranged to, when it is at the lowermost end, stay lower along the vertical direction than the bolts 95 to which the other end of the reflecting member 91 is joined. This allows the ceiling 10 to remain not extended along the vertical direction, hence reducing the size along the vertical direction of the heating unit in the substrate processing apparatus.

The atmosphere in the heating space 18 is flown through the gaps 91a and the outer edges of the reflecting members—91 and passed to four of the first openings 82 provided at equal intervals in the upper side of the heating unit. The flow is gathered in the second opening 83 across the center line of the heating unit before discharged from the discharge outlet 81a to the outside of the heating apparatus 3. Preferably, the width of the gap 91a is smaller than the diameter of the first opening 82. In other words, the gap 91 is narrower than the first opening 82. Accordingly, as shown in FIG. 9, while the first openings 82 are provided to locally face the gaps 91a, they control the flow discharged from the gaps 91a or more particularly permit the flow from the heating space 18 to run uniform along the circumferential direction.

The reactor container 309 includes a thermal equalizer tube 315 made of SiC or quartz and a reactor tube 310 made of SiC or quartz which acts as a reactor. The wafers 305 are loaded as substrates on the boat 300 and placed in the reactor tube 310.

Temperature sensors 330 acting as the second temperature detectors TC2 are mounted on the inner side of the reactor tube 310 while their thermo-couple contacts are assigned as thermal probes to zones Z1 to Z5. Also, L-shaped temperature sensor 320 which is bent to an L shape at the distal end is disposed as the third temperature detector TC3 in the reactor tube 310. More particularly, the L-shaped temperature sensor 320 is bent to an L-shape above the boat 300 in the reactor tube 310. The L shaped temperature sensor 320 has a thermo-couple contact 321 thereof disposed as a thermal probe above the center of the water (the upper side of the boat) and another thermo-couple contact 322 thereof disposed as a thermal probe above the edge of the wafers for measuring the temperature at both the center and the outer edge of the wafer (the upper side of the boat).

The measurements of the temperature produced by the temperature sensors 330 are received by the heater controller 4b for controlling the output of the heating elements at each zone. The data of the temperature measurements at the center and the outer edge produced by the L-shaped temperature sensor 320 is transferred to the temperature monitor 4a. The reflection controller 4c (in the control module) calculates the surface variations (temperature variations) of the wafers at the current time from the data and feeds the actuator 99 with a signal indicative of a difference between the variation and the target value. According to the signal, the shaft 93 is moved for changing the angle of the reflecting members 91 as the feedback controlling action is carried out. Preferably, in case that the difference in the temperature between the center and the outer edge of the wafer surface measured by the L-shaped temperature sensor 320 is greater than a predetermined value of the surface variation, the shaft 93 is moved to change the angle of the reflecting members 91 so as to eliminate the difference through the feedback controlling action. Accordingly, the concentration of the heat on the center of the wafers can automatically be controlled for eliminating the surface variation most favorably.

The action of the substrate processing apparatus 1 will then be described.

The action of processing the wafers 305 starts with loading the boat 300 which carries the wafers 305 into the reactor tube 310 by the movement of the boat elevator and rapidly heating up the same to a desired temperature by the heating action of the heating apparatus 3. When the wafers 305 haven been heated up to the desired temperature by the heating apparatus 3, the reactive gas is introduced from the reactive gas infeed conduit 5x. The action of thermally processing the wafers 305 is performed when the reactive gas has been removed out the reacting gas discharge conduit 6x.

In common, the furnace is kept at a preset temperature, e.g., 550° C., before the boat 300 is loaded in. When the boat 300 has been loaded in, the furnace is heated up to a desired, wafer processing temperature, e.g., 850° C. Both the temperature prior to the loading and the temperature for processing the wafers can selectively be determined depending on the requirements of the processing action in the substrate processing apparatus.

The heating elements 20 at each level are measured at each zone by the temperature monitor 4a and the temperature of the heating action can thus be controlled with the heating elements 20 and the reflecting member 90. The heating element 20 at each zone is a single element. This allows each of the heating elements 20 to be easily identified when its defect such as disconnection is found. The deterioration of the heating elements at each level can also be detected with ease.

After the completion of the processing action, the furnace is rapidly cooled down to a wafer unloading temperature, e.g., 550° C. The cooling of the wafers 305 after the processing action involves opening the flow controller 5a and the air valve 7a to introduce air or inactive gas such as nitrogen gas from the cooling gas supply conduits 5y and 7. The cooling gas received from the cooling gas supply conduit is introduced from the extending bores 40a of the fast cooling pipes 40 into the heating space 18 where it quickly cool down the heating elements 20 from both, inner and outer, sides.

Using the construction of the cooling pipes 40, the speed for cooling the heater and thus the wafers can be improved thus to enhance the throughput of the wafer processing action. Also, since the cooling pipes 40 serve as the retainers for retaining the heating elements and the cooling gas guiding passages, no separate conduits for feeding the heater cooling gas will be needed while the heating area on the inner wall of the furnace is increased. Moreover, the openings of the extending bores 40a of the cooling pipes 40 are located more inward than the heating elements 20, hence protecting the heating elements 20 from being cooled down locally by the cooling gas. Accordingly, the heating elements 20 is prevented from local deflection, twisting, and fracture and can thus suffer from no disconnection or no direct contact with the reactor tube 310.

The cooling gas to be introduced into the tubular gas passage 14 is dispersed from the cooling gas infeed duct 7y which is large in the volumetric size and can thus enter the gas passage 14 uniformly while its biasing flow is controlled. When having been conveyed through the conduits 61, the gas passage 14, and the fast cooling pipes 40 into the heating space 18, the cooling gas runs upwardly from the heating space 18 and is finally discharged from the discharge conduit 81. The inner side of the inner shell 50 is cooled down by the cooling gas running upwardly through the heating space 18 while the thermal equalizer tube 315 and the reactor tube 310 are cooled down by the cooling gas running upwardly through the heating space 18 and the thermal equalizer internal space 317. As the result, the wafers 305 in the reactor tube 310 can quickly be cooled down. The heating elements 20 made of Fe—Cr—Al, carbon, or SiC enables rapid heating up to a higher temperature while the rapid cooling down of the heating module 3 by the cooling gas is carried out.

When the cooling action has been completed, the boat elevator lifts down the boat 300 and the processed wafers 305 are unloaded from the boat 300. In case that the de-pressurizing action is involved, the boat 300 is lifted down after the pressure in the reactor chamber returns back to an atmosphere level.

The present invention described in this specification is also implemented in the form of the following embodiments.

1) A substrate processing apparatus is provided for controlling the action of a moving mechanism in response to a difference in the temperature between the center and the outer edge of a substrate which is calculated from the measurements of the temperature produced by first temperature detectors for measuring the temperature at the outer edge (circumferential end) of the substrate in a reactor container and a second temperature detector for measuring the temperature at the center (region) of the substrate in the reactor container.

2) The substrate processing apparatus may be modified in which the reflectors are mounted to the upper end of the interior of a heating apparatus.

3) A method of manufacturing semiconductor devices is provided comprising a substrate loading step of loading a substrate into a reactor container, a substrate processing step of heating up the interior of the reactor container with a heating apparatus to process the substrate, and a substrate unloading step of unloading the processed substrate from the reactor container, wherein the substrate processing step involves controlling the action of a moving mechanism with a control apparatus responding to a difference at the surface between the center and the outer edge of the substrate thus to shift the position of reflectors, which reflect rays of the heat in the reactor container, for changing the reflection of the rays of the heat.

4) The method of manufacturing semiconductor devices may be modified in which the control apparatus in the substrate processing step controls the action of the moving mechanism in response to a difference in the temperature between the center and the outer edge of the substrate which is calculated from the measurements of the temperature produced by first temperature detectors for measuring the temperature at the outer edge of the substrate in the reactor container and a second temperature detector for measuring the temperature at the center of the substrate in the reactor container.

5) A heating apparatus, a substrate processing apparatus, and holding structure for heating elements is provided comprising a tubular side wall, and heating elements arranged of a sheet form having a number of gaps, wherein the side wall has an inner side thereof finished for reflecting heat, the heating elements are arrayed on the inner side of the tubular side wall, the heating element are arranged to emit the heat from the front side of element portion of the heating element towards the heating space, and the heat emitted from the back side of the element portion is reflected by the inner side and passed through the gaps to enter the heating space. In this structure, the width of the gap 24 is sufficiently greater than the width of the element portion 23 of the heating element for effectively utilizing rays of the heat reflected from the inner side of the tubular side wall. Since the gaps are arranged to extend along the axial direction of the tubular side wall and the heating elements are supported at the upper end along the axial direction by holding members, the reflected heat can be utilized at optimum efficiency while the heating elements are improved in the surface density, thus minimizing the amount of the heating elements and increasing the thermal response. Also, as the inner side of the tubular side wall is arranged of a concave shape, its reflection of the heat passing through the gaps and radiating towards the heating space can be concentrated at higher effectiveness. The concave inner side may preferably have an arcuate surface.

It is understood that the present invention is not limited to the described embodiments but may be modified without departing from the scope of the present invention.

In the foregoing embodiment, the reflecting members 91 are controlled by the feedback control action where the surface variations of the wafer are calculated from the data of the temperature at the center and the outer edge measured by the L-shaped temperature sensor 320 and compared with the target values to determine the angle of the reflecting members 91. However, the action of controlling the reflecting members is not limited to the feedback control action but may be implemented using a program.

The wafer processing action (including the increase and decrease of the temperature and the controlling of gas flow) is controlled with the use of a program called a recipe. The recipe is composed of events including the temperature increase, the stabilization, and the temperature decrease. Each event incorporates a set of processing conditions including "the duration of execution", "the temperature of heater", "the opening and closing timing of valves", and "the flow of gas". For controlling with the program, the processing conditions may include "the angle of reflectors" for adjusting the angle of the reflectors. It can be predetermined, for example, that the angle of the reflectors is set "to an angle A at the event of the temperature increase" or "to an angle B at the event of the stabilization (in the processing and layer forming action)".

Figure 10:
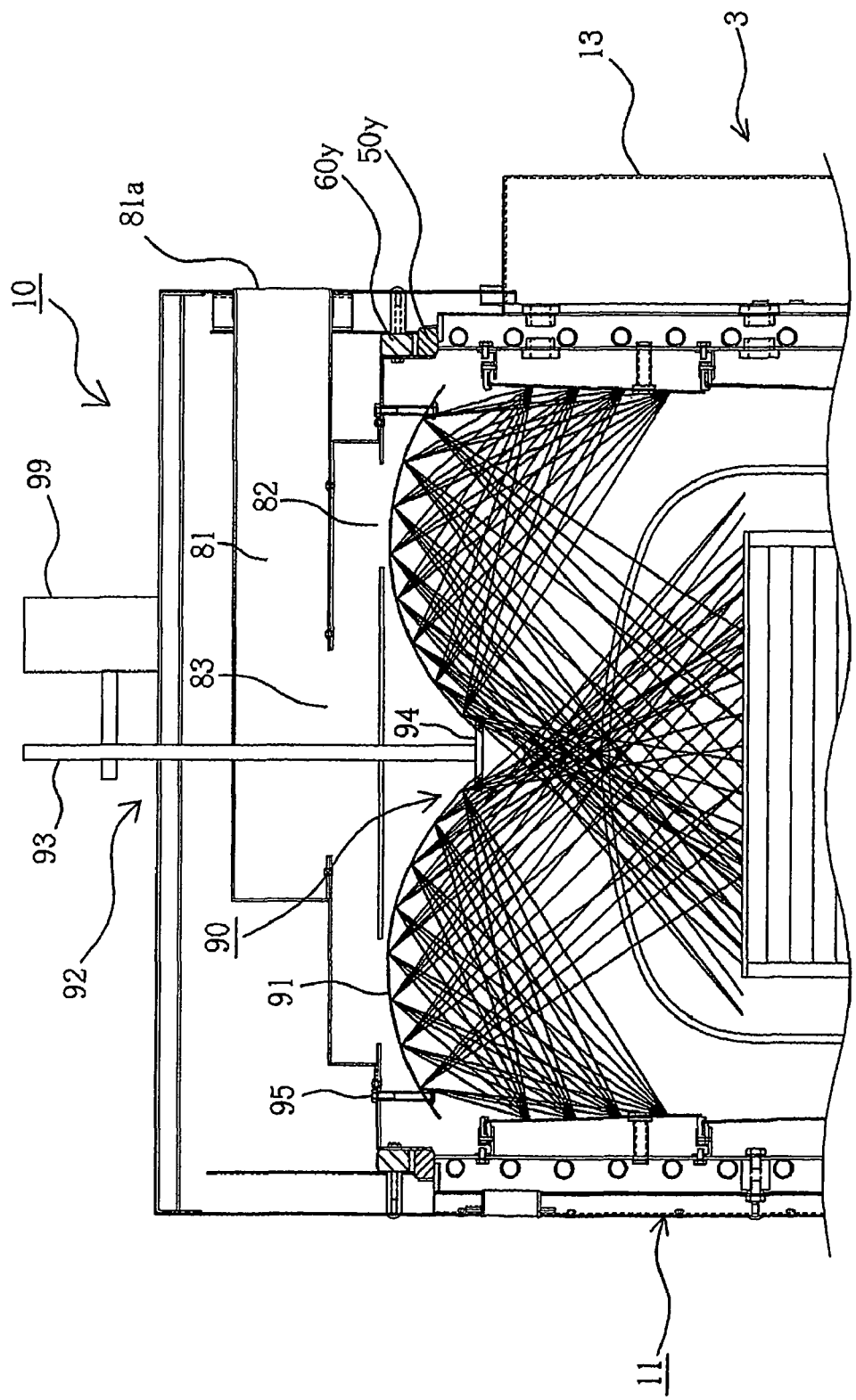
FIG. 10 is an enlarged view of the section D in FIG. 2 showing a state of the reflectors at the initial stage of the temperature increasing action.
Figure 11:
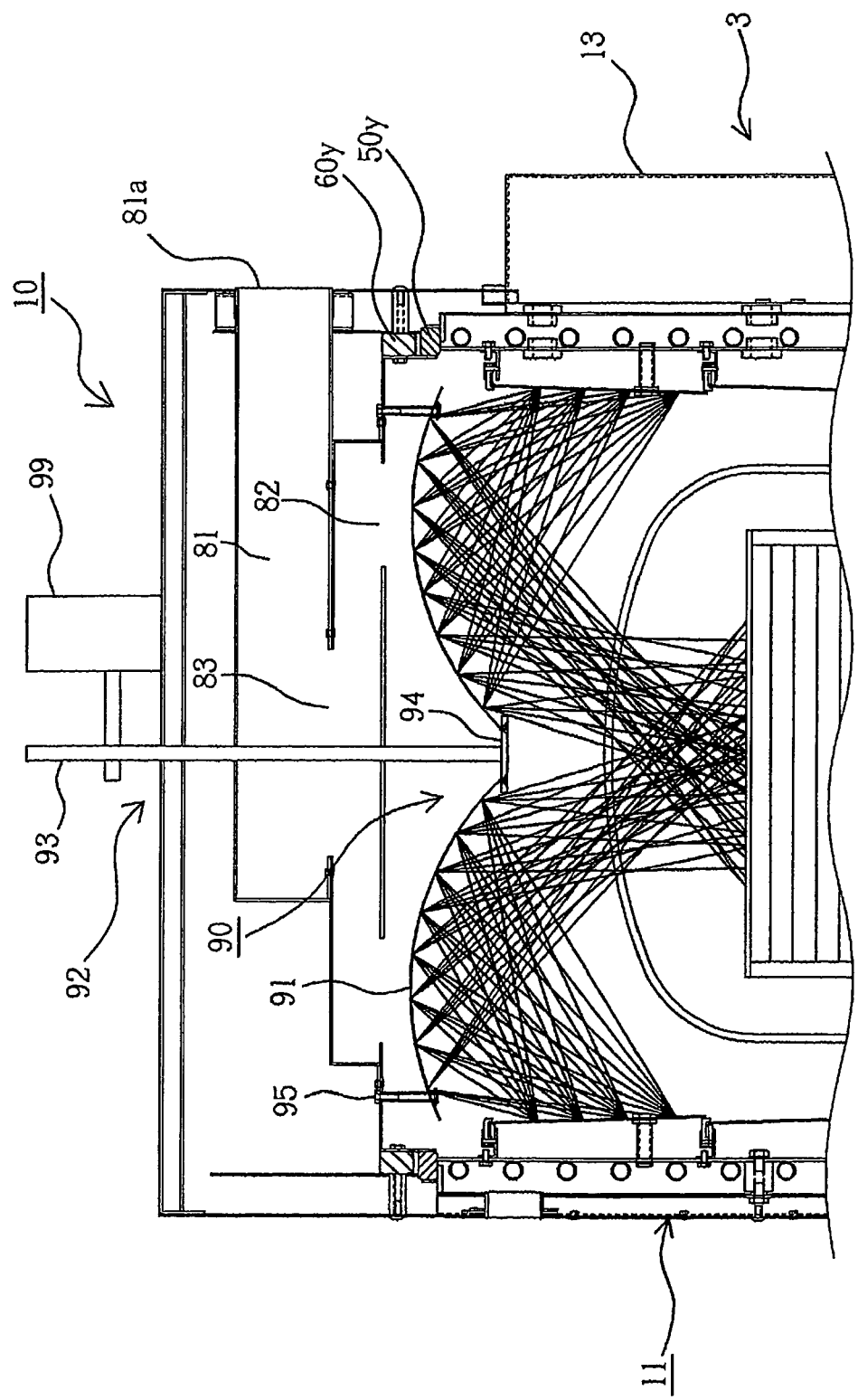
FIG. 11 is an enlarged view of the section D in FIG. 2 showing a state of the reflectors at the close-to-end stage of the temperature increasing action.

As described, the output of the heating elements is different between the temperature increasing event and the stabilizing event. At the temperature increasing event, the output has to be increased higher than the stabilizing event for heating up the wafer uniformly and quickly. At the stabilizing event, the output remains lower than the temperature increasing event thus causing the temperature to stay lower at the center than at the outer edge of the wafer because of the discharge conduit 81 in the ceiling 10 and producing a surface variation of the wafer. For compensation, the movement of the shaft 93 at the temperature increasing event is determined to set the angle of the reflectors for quickly heating up the wafer, as shown in FIG. 10. It is also determined to set the angle for concentrating the heat on the center of the wafer at the stabilizing event, as shown in FIG. 11. As the radiation of the heat is relatively great at the temperature increasing, it hardly produces a surface variation at the center of the wafer, even if it is dispersed, while promoting the heating speed to favorably heat up the wafer. On the other hand, the radiation of the heat is small at the stabilizing event and its concentration on the center of the wafer can successfully avoid the generation of any surface variation. Accordingly, as the angle of the reflectors is determined depending on the event, the surface variation will be minimized.

It is also possible to select the angle of the reflecting members from not one but more pre-settings. For example, the angle is set to a degree for dispersing the heat at the first half of the temperature increasing event thus to heat up the entirety of the wafer uniformly and quickly as shown in FIG. 10. Then, at the second half of the temperature increasing event, the angle is set to another degree for concentrating the heat on the proximity of the center of the wafer as shown in FIG. 11. The angle can arbitrarily be adjusted at more precise degrees.

The action of setting the angle of the reflectors may be carried out from the measurement with the L-shaped temperature sensor 320 at the initial stage (the start up) of the substrate processing apparatus prior to the wafer processing steps or the post-maintenance stage (just after the maintenance action) of the substrate processing apparatus. Alternatively, the condition for setting the angle of the reflectors may be determined from a result of the trial action of layer forming (annealing) which has been conducted using a testpiece wafer. Although the setting of the angle is explained with the temperature increasing event, it may equally be determined for the stabilizing event, the temperature decreasing event, or any other event.

In the above described embodiment, the thermocouple contacts (contact 321 and contact 322) of the two different temperature detectors are used for calculating the surface variations of the wafer and their different combination may be employed with equal success. For example, the thermal probes in the zone Z1 of the temperature sensors 330 and the L-shaped temperature sensor 320 (with the contact 321) may be used in a combination. Also, three or more of the thermal probes may be used for calculating the surface variation of the wafer.

Although the thermocouple contacts are placed above the boat 300 for producing the measurements on the wafer in the embodiment, they may be disposed at other locations. For example, the thermocouple contacts can be bonded to or embedded in the upper side of the boat 300. Alternatively, the thermocouple contacts may be disposed between the boat 300 and the wafer 305 or bonded to the wafer.

For example, the control module may be arranged to save the measurement of a difference in the layer thickness between the center and the outer edge at the surface of a wafer in advance and control the action of the moving mechanism for determining the angle of the reflectors so as to eliminate the difference in the layer thickness. Preferably, a difference in the thickness of the layer formed on a wafer is calculated in advance between the center and the outer edge at the surface of the wafer and, when the difference is greater than a permitted reference value which has been predetermined, the shaft 93 may be moved so as to minimize the difference.

Although the temperature sensors 320, 330 are employed as the second and third temperature detectors TC2, TC3 respectively in the embodiment, they may be replaced by a single temperature sensor having a corresponding number of the thermocouple contacts which independently act as the second and third temperature detectors TC2 and TC3.

The thermal probes are not limited to the thermocouple contacts of the temperature detector but may be implemented by radiation-type thermometers or any other devices which can measure the temperature regardless of the shape and the arrangement.

The reflecting members 91 and the moving mechanism 92 may also be modified. For example, the reflecting members 91 may be lifted up and down at their outer or circumferential end or shifted from one horizontal position to another for optimizing the reflection of the heat. The above embodiment for moving the reflecting members 91 along the center axis of the intermediate unit 11 is more favorable in respect of the construction to be simplified, the surface between the tip end and the outer edge of the reflecting members 91 to be used for focusing the heat emitted from the heating elements 20 on the center of the wafer, and the reflecting members 91 arranged in point symmetrical relationship about the shaft 93.

Figure 12:
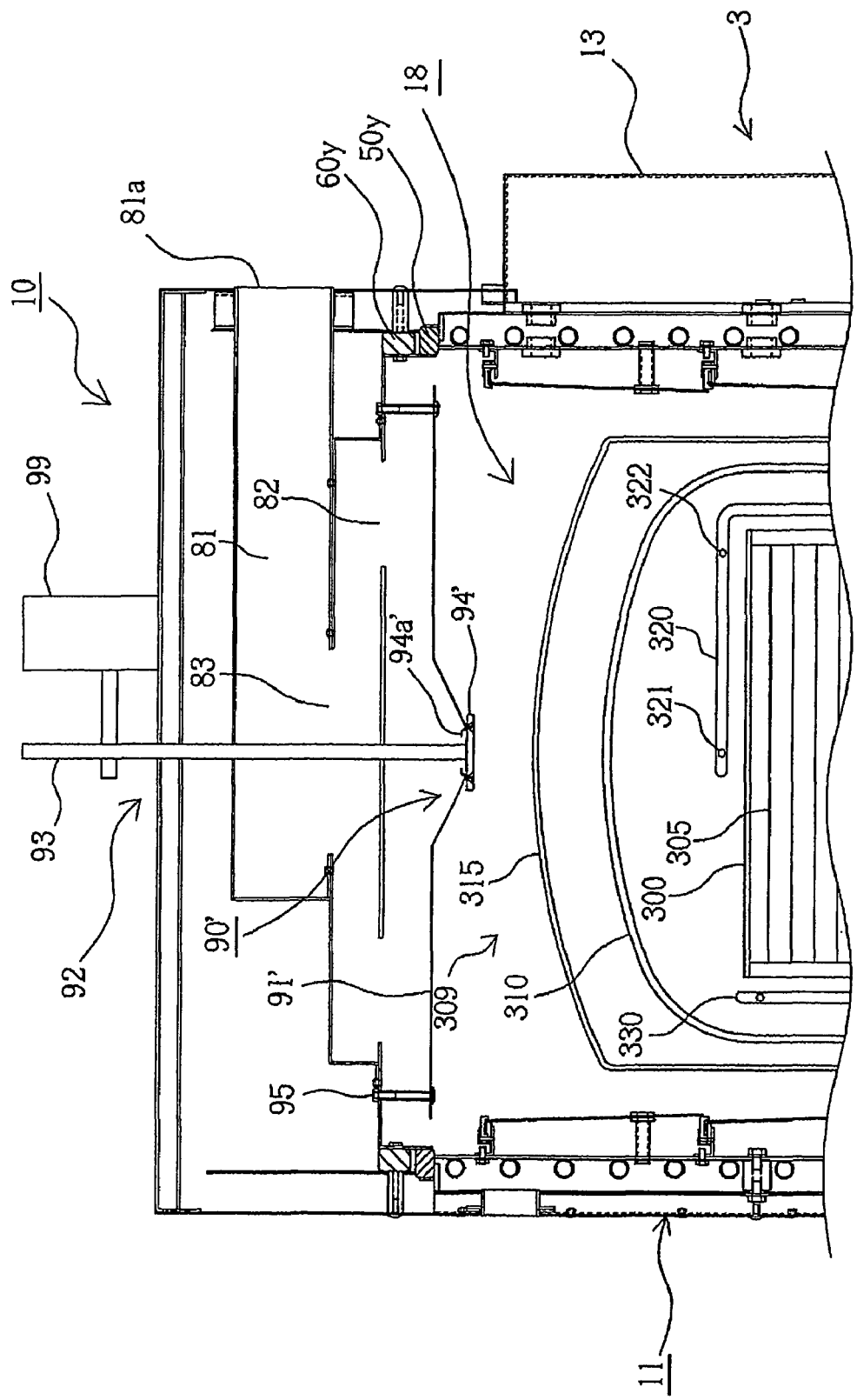
FIG. 12 is a cross sectional view taken along the line E-E of FIG. 8 showing modifications of the reflectors according to the present invention.

For example, a modification 91' of the reflecting member shown in FIG. 12 comprises a planar portion and a sloped portion provided by bending one end. The bent is not limited to one end but may be provided at two or more regions. Also, the center plate for holding the tip ends of the reflectors may be modified to a desired shape corresponding to the shape of the reflecting members.

The reflector 90 is not limited to at the upper end of the heating apparatus 3 but may be mounted to the lower end as located at either end of the heating elements 20 arrayed in a cylindrical form. However, the lower end of the heating apparatus 3 has an opening provided therein for unloading the boat while the upper end has an exhaust opening provided therein where the temperature can easily be decreased. Accordingly, the mounting to the upper end is preferable.

Although the reactor container is equipped with the thermal equalizer tube and the reactor tube in the description, it may include only the reactor tube but not the thermal equalizer tube. Alternatively, the number of the tubes is not limited to two but may be one or three with equal success.

The thermal processing action may be applied to not only the oxidation or the diffusion but also the reflow action, the annealing action, or the layer forming action for planarization or activation of the carriers after the ion implantation. The substrate is not limited to a wafer but may be any other relevant planer object such as a photo mask, a printed circuit board, a liquid crystal panel, an optical disk, or a magnetic disk. The present invention is also applicable to not only a batch-type heat processing apparatus or a layer-type heat processing apparatus but also a semiconductor manufacturing system equipped with a heater unit. The inner side of the inner shell 50 or the reflecting member 91 may be mirror finished by not only stainless polishing but also plating with gold, platinum, or any other noble metal.

The present invention is described in the form of the preferred embodiments and may equally be implemented by comprehensively the following embodiments.

A heating apparatus according to the present invention is provided comprising: a wall for surrounding and defining a heating space; a heating element mounted on the inner side of the wall; reflecting members for reflecting the heat emitted from the heating element; a moving unit joined to one end of each of the reflecting members for moving the reflecting members; and pivotal members joined to the reflecting members beside more their respective other side than one side of the reflecting members for controlling as pivots the movement of the reflecting member driven by the moving unit. In this case, the reflecting members are arranged in an annular form while the moving unit is joined to the reflecting members at the center of the annular form, and the movement of the reflecting member by the function of the pivotal members as pivots can be controlled by the action of the moving unit.

Preferably, the reflecting members may be arranged at intervals of a gap. Also, the reflecting members may be configured of a triangular shape of which the proximal end stays at the center of the annular form. The reflecting members may be allocated substantially at equal intervals along the circumferential direction.

In particular, the wall may comprise at least a tubular side wall and a ceiling wall disposed at the upper end of the side wall and the heating element is held by the side wall while the moving unit is held by the ceiling wall. In this case, the ceiling wall preferably has an opening provided therein to communicate with an exhaust opening for exhausting the heating space and at least one of the gaps between the reflecting member is sized smaller than the diameter of the opening. The ceiling wall may have an exhaust opening provided therein for exhausting the heating space and arranged to communicate with apertures provided along the circumferential direction about the center of the moving unit, the reflecting members are configured of a triangular shape as arranged in an annular form at intervals of the gap with their proximal ends disposed at the center of the annular form, and at least one of the gaps between the reflecting members is sized smaller than the diameter of the opening. The heating apparatus may further comprise a moving mechanism for driving the moving unit to move the reflecting members and change the angle of the reflecting surfaces of the reflecting members by acting the pivotal members as pivots to the heating element for controlling the reflection of the heat. Preferably, the reflecting members may be shaped into an arch to extend from the center of the heating space to the close-to-end of the heating space.

Alternatively, the reflecting members may extend from the axial center to the vertical end of the side wall, perpendicular to the circumferential direction, at which the heating element is held. The reflecting members may preferably be bulged towards the ceiling wall side.

A substrate processing apparatus according to the present invention is provided comprising a reactor container disposed in the heating space of the heating apparatus defined in claim 1 for processing a substrate internally. The substrate processing apparatus may further comprise a control unit for, when a difference in the temperature or the layer thickness between the outer and the center edge of the substrate is greater than a reference value, driving the moving unit. Alternatively, the substrate processing apparatus may further comprise a control unit for calculating a difference in the temperature between the outer and the center edge of the substrate from the measurements of a first temperature detector for measuring the temperature at the outer edge of the substrate in the reactor container and a second temperature detector for measuring the temperature at the center of the substrate in the reactor container and, when the difference is greater than a reference value, driving the moving unit. Preferably, the reflecting members may be configured of an arcuate shape enough to extend from the center to the outer edge of the substrate. Another substrate processing apparatus according to the present invention is provided comprising: a reactor container for processing a substrate; a heating apparatus disposed at the circumferential side of the reactor container for heating up the substrate in the reactor container, the heating apparatus comprising a heating element and a reflecting member for reflecting the heat emitted from the heating element; a moving mechanism for moving the reflecting member to change the reflection of the heat; and a control apparatus for controlling the action of the moving mechanism in response to a different at the surface between the outer edge and the center of the substrate.

A method of manufacturing semiconductor devices according to the present invention is provided comprising the steps of: loading a substrate into a reactor container which is disposed in a heating space of a heating apparatus, the heating apparatus comprising a wall for surrounding and defining the heating space, a heating element mounted on the inner side of the wall, reflecting members for reflecting the heat emitted from the heating element, a moving unit joined to one end of each of the reflecting members for moving the reflecting members, and pivotal members joined to reflecting members beside more their respective other side than one side of reflecting members for controlling as pivots the movement of the reflecting member driven by the moving unit, and heating up the interior of the reactor container with the heat emitted from the heating element and a reflection of the heat reflected by the reflecting members for processing the substrate.

The present invention is favorably applicable to a substrate processing apparatus for use in, for example, the oxidation or the diffusion, the reflow action, the annealing action, and the layer forming action by thermal CVD technique for planarization or activation of the carriers after the ion implantation over a semiconductor wafer on which semiconductor integrated circuit assemblies (semiconductor devices) are developed. The present invention is particularly advantageous in the processing action at lower temperatures of the substrate processing apparatus.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

The disclosure of Japanese Patent Application Nos. 2007-166998 and 2008-154369 filed on Jun. 25, 2007 and Jun. 12, 2008 respectively, including specification, drawings and claims is incorporated herein by reference in its entirety.

What is claimed is:

1. A heating apparatus comprising:
a wall for surrounding and defining a heating space;
a heating element mounted on the inner side of the wall;
reflecting members for reflecting the heat emitted from the heating element;
a moving unit joined to one end of each of the reflecting members for moving the reflecting members; and
pivotal members joined to the reflecting members for controlling as pivots the movement of the reflecting member driven by the moving unit, wherein
the reflecting members are arranged in an annular form while the moving unit is joined to the reflecting members at the center of the annular form, and the movement of the reflecting member by the function of the pivotal members as pivots can be controlled by the action of the moving unit.

2. A heating apparatus according to claim 1, wherein the reflecting members are arranged at intervals of a gap.

3. A heating apparatus according to claim 1, wherein the reflecting members are configured of a triangular shape of which the proximal end stays at the center of the annular form.

4. A heating apparatus according to claim 2, wherein the reflecting members are arranged substantially at equal intervals along the circumferential direction.

5. A heating apparatus according to claim 1, wherein the wall comprises at least a tubular side wall and a ceiling wall disposed at the upper end of the side wall and the heating element is held by the side wall while the moving unit is held by the ceiling wall.

6. A heating apparatus according to claim 5, wherein the ceiling wall has an opening provided therein to communicate with an exhaust opening for exhausting the heating space and a gap between the reflecting members is sized smaller than the diameter of the opening.

7. A heating apparatus comprising:
a wall for surrounding and defining a heating space;
a heating element mounted on the inner side of the wall;
reflecting members for reflecting the heat emitted from the heating element;
a moving unit joined to one end of each of the reflecting members for moving the reflecting members; and
pivotal members joined to the reflecting members for controlling as pivots the movement of the reflecting member driven by the moving unit, wherein
the reflecting members are arranged at intervals of a gap,
the reflecting members are arranged substantially at equal intervals along the circumferential direction,
the wall has an exhaust opening provided therein for exhausting the heating space and arranged to communicate with apertures provided along the circumferential direction about the center of the moving unit, the reflecting members are configured of a triangular shape as arranged in an annular form at intervals of the gap with their proximal ends disposed at the center of the annular form, and at least one of the gaps between the reflecting members is sized smaller than the diameter of the opening.

8. A heating apparatus according to claim 1, further comprising:
a moving mechanism for driving the moving unit to move the reflecting members and change the angle of the reflecting surfaces of the reflecting members by acting the pivotal members as pivots to the heating element for controlling the reflection of the heat.

9. A heating apparatus according to claim 1, wherein the reflecting members are shaped into an arch to extend from the center of the heating space to the close-to-end of the heating space.

10. A heating apparatus according to claim 6 comprising:
a wall for surrounding and defining a heating space;
a heating element mounted on the inner side of the wall;
reflecting members for reflecting the heat emitted from the heating element;
a moving unit joined to one end of each of the reflecting members for moving the reflecting members; and
pivotal members joined to the reflecting members for controlling as pivots the movement of the reflecting member driven by the moving unit, wherein
the wall comprises at least a tubular side wall and a ceiling wall disposed at the upper end of the side wall and the heating element is held by the side wall while the moving unit is held by the ceiling wall and the reflecting members extend from the axial center to the vertical end of the side wall, perpendicular to the circumferential direction, at which the heating element is held.

11. A heating apparatus comprising:

a wall for surrounding and defining a heating space;

a heating element mounted on the inner side of the wall;

reflecting members for reflecting the heat emitted from the heating element;

a moving unit joined to one end of each of the reflecting members for moving the reflecting members; and pivotal members joined to the reflecting members for controlling as pivots the movement of the reflecting member driven by the moving unit, wherein the wall comprises at least a tubular side wall and a ceiling wall disposed at the upper end of the side wall and the heating element is held by the side wall while the moving unit is held by the ceiling wall and the reflecting members are bulged towards the ceiling wall side.

12. A substrate processing apparatus comprising:

a reactor container disposed in the heating space of the heating apparatus defined in claim 1 for processing a substrate internally a control unit for, when a difference in the temperature or the layer thickness between the outer and a center edge of the substrate is greater than a reference value, driving the moving unit.

13. A substrate processing apparatus comprising:

a reactor container disposed in the heating space of the heating apparatus defined in claim 1 for processing a substrate internally a control unit for calculating a difference in the temperature between the outer and the center edge of the substrate from the measurements of a first temperature detector for measuring the temperature at the outer edge of the substrate in the reactor container and a second temperature detector for measuring the temperature at the center of the substrate in the reactor container and, when the difference is greater than a reference value, driving the moving unit.

14. A substrate processing apparatus comprising:

a reactor container disposed in the heating space of the heating apparatus defined in claim 1 for processing a substrate internally, wherein the reflecting members are configured of an arcuate shape enough to extend from the center to the outer edge of the substrate.

\* \* \* \* \*